US009975320B2

(12) United States Patent
Duan et al.

(10) Patent No.: US 9,975,320 B2
(45) Date of Patent: May 22, 2018

(54) DIFFUSION BONDED PLASMA RESISTED CHEMICAL VAPOR DEPOSITION (CVD) CHAMBER HEATER

(71) Applicant: Applied Materials, Inc., Santa Clara, CA (US)

(72) Inventors: Ren-Guan Duan, Fremont, CA (US); Juan Carlos Rocha-Alvarez, San Carlos, CA (US); Jianhua Zhou, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 579 days.

(21) Appl. No.: 14/153,729

(22) Filed: Jan. 13, 2014

(65) Prior Publication Data

US 2015/0201461 A1 Jul. 16, 2015

(51) Int. Cl.

| | |
|---|---|
| ***H05B 3/68*** | (2006.01) |
| ***H05B 3/02*** | (2006.01) |
| ***B32B 37/24*** | (2006.01) |
| ***H01L 21/67*** | (2006.01) |
| ***H05B 3/14*** | (2006.01) |
| ***H05B 3/42*** | (2006.01) |
| ***H01L 21/687*** | (2006.01) |
| ***B32B 38/00*** | (2006.01) |

(52) U.S. Cl.

CPC .......... *B32B 37/24* (2013.01); *B32B 38/0008* (2013.01); *H01L 21/67103* (2013.01); *H01L 21/68757* (2013.01); *H05B 3/143* (2013.01); *H05B 3/42* (2013.01); *B32B 2037/246* (2013.01); *B32B 2038/0016* (2013.01); *B32B 2264/107* (2013.01); *B32B 2315/02* (2013.01)

(58) Field of Classification Search

CPC ...... B32B 2037/246; B32B 2038/0016; B32B 2264/107; B32B 2315/02; B32B 37/24; B32B 38/0008; H01L 21/67103; H01L 21/68757; H05B 3/143; H05B 3/42

USPC ............................ 219/443.1–444.1, 542–548

See application file for complete search history.

(56) References Cited

U.S. PATENT DOCUMENTS 5,272,120 A * 12/1993 Kosuda .................... G01B 3/30 219/121.6
6,444,957 B1 * 9/2002 Kitagawa .......... H01L 21/67103 118/725
2002/0185487 A1 12/2002 Divakar et al.

(Continued)

FOREIGN PATENT DOCUMENTS

JP 2002-192655 A 7/2002

OTHER PUBLICATIONS

PCT Notification of Transmittal of the International Search Report and the Written Opinion of the International Searching Authority for International Application No. PCT/US2015/011002 dated Apr. 21, 2015; 10 total pages.

*Primary Examiner* — Sang Y Paik

(74) *Attorney, Agent, or Firm* — Patterson + Sheridan LLP

(57) ABSTRACT

Embodiments of the disclosure generally relate to heated substrate supports having a protective coating thereon. The protective coating is formed from pure yttria or alloys predominantly of yttria. The protective coating is diffusion bonded to the heater plate of the substrate support. Two distinct silicon containing layers are formed between the heater plate and the protective coating as the result of the diffusion bonding.

12 Claims, 2 Drawing Sheets

(56) References Cited

U.S. PATENT DOCUMENTS

| | | | | |
|---|---|---|---|---|
| 2006/0011611 | A1* | 1/2006 | Goto | H05B 3/143 219/444.1 |
| 2006/0166804 | A1* | 7/2006 | Sprenger | C03C 3/062 501/10 |
| 2006/0185795 | A1 | 8/2006 | Choi et al. | |
| 2007/0166477 | A1 | 7/2007 | Chang | |
| 2012/0141661 | A1 | 6/2012 | Cho et al. | |

* cited by examiner

DIFFUSION BONDED PLASMA RESISTED CHEMICAL VAPOR DEPOSITION (CVD) CHAMBER HEATER

BACKGROUND

Field

Embodiments of the present invention generally relate to heated substrate supports.

This application is related to U.S. patent application Ser. No. 14/106,604 filed Dec. 13, 2013.

Description of the Related Art

Process chambers and components present within process chambers which are used in the fabrication of electronic devices and micro-electro-mechanical structures (MEMS) and are frequently constructed from aluminum and aluminum-containing materials, such as aluminum nitride. However, the components are susceptible to erosion from halogen-containing cleaning plasma and gases frequently used to clean process chamber interiors. The erosion reduces the usable life of the process chamber components, and, additionally, introduces undesirable defects and contamination into the processing environment. The erosion of a heated substrate support is of particular concern due to the direct contact of the heated substrate support with processed substrates, affecting the wafer thermal uniformity, film deposition rate, and density. The erosion of a heated substrate support is of particular concern due to also the higher temperature and the easier formation of aluminum fluorides that redeposits on internal chamber surfaces, increasing the potential for introducing particle and contamination to the substrates Therefore, there is a need in the art for heated substrate support that is less susceptible to erosion.

SUMMARY

Embodiments of the present invention generally relate to heated substrate supports having a protective coating thereon. The protective coating is formed from pure yttria or alloys predominantly of yttria. The protective coating is diffusion bonded to the heater plate of the substrate support. Two distinct silicon containing layers are formed between the heater plate and the protective coating as the result of the diffusion bonding.

In one embodiment, a substrate support is disclosed. The substrate support comprises a stem, a heater plate coupled to the stem, and a first layer disposed on the heater plate. The first layer comprises silicon. The substrate support further comprises a second layer disposed on the first layer, where the second layer comprises silicon and is distinct from the first layer, and a third layer disposed on the second layer, wherein the third layer comprises yttria or predominantly yttria.

In another embodiment, a method for protecting a heater plate is disclosed. The method comprises depositing a first layer on a surface of a plate, where the first layer comprises silicon and the plate comprises yttria or predominantly yttria, placing the first layer and the plate on the heater plate, where the first layer is disposed on the heater plate, and bonding the plate to the heater plate by diffusion bonding.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to heated substrate supports having a protective coating thereon. The protective coating is formed from pure yttria or alloys predominantly of yttria. The protective coating is diffusion bonded to the heater plate of the substrate support. Two distinct silicon containing layers are formed between the heater plate and the protective coating as the result of the diffusion bonding.

Figure 1:
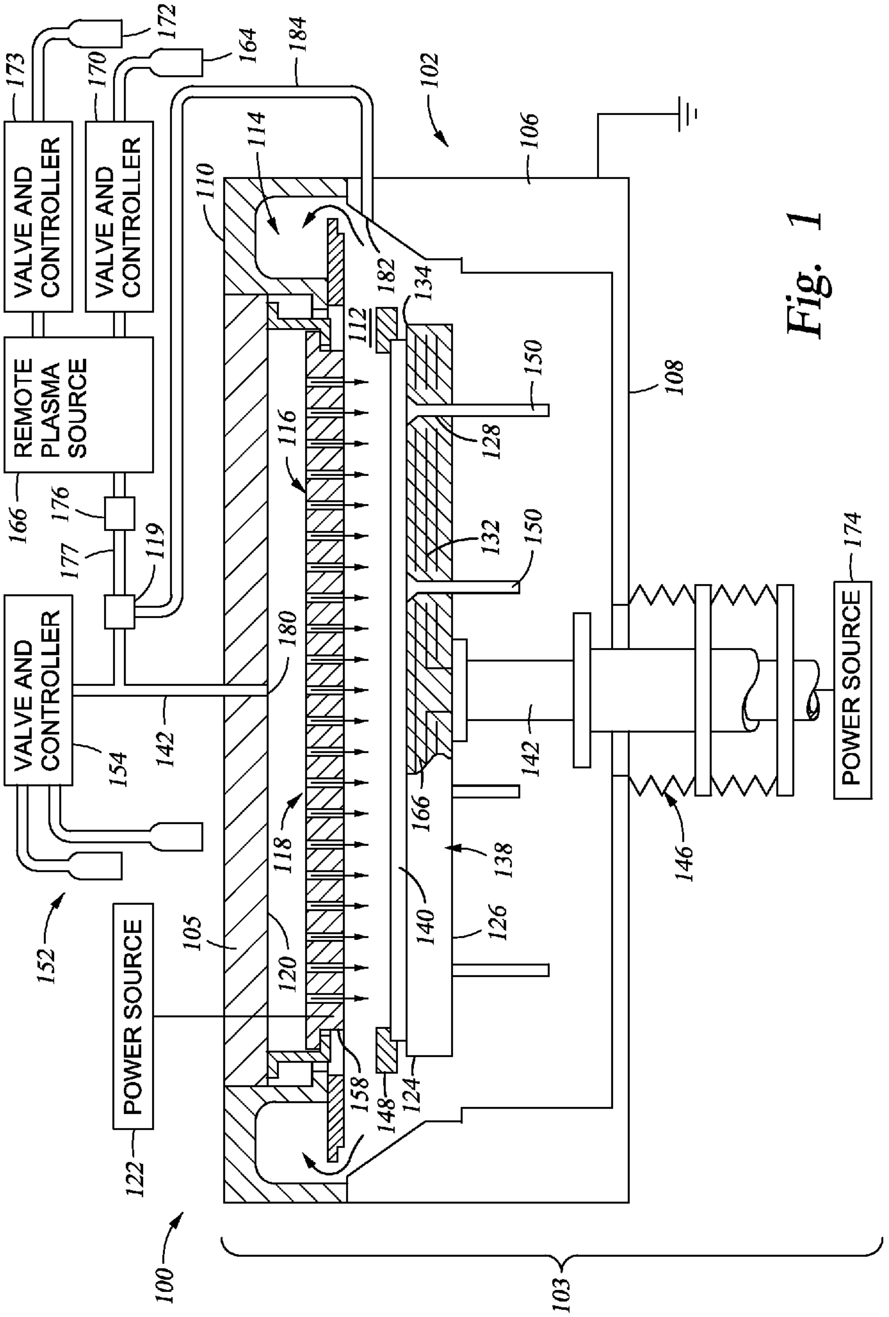
FIG. 1 is a schematic cross-sectional view of a chemical vapor deposition chamber according to an embodiment.

FIG. 1 is a schematic cross-sectional view of a chemical vapor deposition system 100 according to an embodiment of the invention. The system 100 generally includes a chemical vapor deposition chamber 103 coupled to a precursor supply 152. The chemical vapor deposition chamber 103 has sidewalls 106, a bottom 108, and a lid assembly 110 that define a processing volume or region 112 inside the chemical vapor deposition chamber 103. The processing region 112 is typically accessed through a port (not shown) in the sidewalls 106 that facilitate movement of a substrate 140 into and out of the chemical vapor deposition chamber 103. The sidewalls 106 and bottom 108 are typically fabricated from aluminum, stainless steel, or other materials compatible with processing. The sidewalls 106 support a lid assembly 110 that contains a pumping plenum 114 that couples the processing region 112 to an exhaust system that includes various pumping components (not shown). The sidewalls 106, bottom 108, and lid assembly 110 define the chamber body 102.

A gas inlet conduit or pipe 142 extends into an entry port or inlet 180 in a central lid region of the chamber body 102 and is connected to sources of various gases. A precursor supply 152 contains the precursors that are used during deposition. The precursors may be gases or liquids. The particular precursors that are used depend upon the materials that are to be deposited onto the substrate. The process gases flow through the inlet pipe 142 into the inlet 180 and then into the chamber 103. An electronically operated valve and flow control mechanism 154 controls the flow of gases from the gas supply into the inlet 180.

A second gas supply system is also connected to the chamber through the inlet pipe 142. The second gas supply system supplies gas or plasma that is used to clean, e.g., removing deposited material, the inside of the chamber after one or more chemical vapor deposition processes have been performed in the chamber. In some situations, the first and second gas supplies can be combined.

The second gas supply system includes a source 164 of a cleaning gas (or liquid), such as nitrogen trifluoride or sulfur hexafluoride, a remote plasma source 166 which is located outside and at a distance from the chemical vapor deposition chamber, an electronically operated valve and flow control mechanism 170, and a conduit or pipe 177 connecting the remote plasma source to the chemical vapor deposition chamber 103. Such a configuration allows interior surfaces of the chamber to be cleaned using a remote plasma source.

The second gas supply system also includes one or more sources 172 of one or more additional gases (or liquids) such as oxygen or a carrier gas. The additional gases are connected to the remote plasma source 166 through another valve and flow control mechanism 173. The carrier gas aids in the transport of the reactive species generated in the remote plasma source to the deposition chamber and can be any nonreactive gas that is compatible with the particular cleaning process with which it is being used. For example, the carrier gas may be argon, nitrogen, or helium. The carrier gas also may assist in the cleaning process or help initiate and/or stabilize the plasma in the chemical vapor deposition chamber.

Optionally, a flow restrictor 176 is provided in the pipe 177. The flow restrictor 176 can be placed anywhere in the path between the remote plasma source 166 and the deposition chamber 103. The flow restrictor 176 allows a pressure differential to be provided between the remote plasma source 166 and the deposition chamber 103. The flow restrictor 176 may also act as a mixer for the gas and plasma mixture as it exits the remote plasma source 166 and enters the deposition chamber 103.

The valve and flow control mechanism 170 delivers gas from the source 164 into the remote plasma source 166 at a user-selected flow rate. The remote plasma source 166 may be an RF plasma source, such as an inductively coupled remote plasma source. The remote plasma source 166 activates the gas or liquid from the source 164 to form reactive species which are then flowed through the conduit 177 and the inlet pipe 142 into the deposition chamber through the inlet 180. The inlet 180 is, therefore, used to deliver the reactive species into the interior region of the chemical vapor deposition chamber 103.

The lid assembly 110 provides an upper boundary to the processing region 112. The lid assembly 110 includes a central lid region 105 in which the inlet 180 is defined. The lid assembly 110 typically can be removed or opened to service the chemical vapor deposition chamber 103. In one embodiment, the lid assembly 110 is fabricated from aluminum (Al). The lid assembly 110 includes a pumping plenum 114 formed therein coupled to an external pumping system (not shown). The pumping plenum 114 is utilized to channel gases and processing by-products uniformly from the processing region 112 and out of the chemical vapor deposition chamber 103.

The gas distribution assembly 118 is coupled to an interior side 120 of the lid assembly 110. The gas distribution assembly 118 includes a perforated area 116 in a gas distribution plate 158 through which gases, including reactive species generated by the remote plasma source and processing gases for chemical vapor deposition, are delivered to the processing region 112. The perforated area 116 of the gas distribution plate 158 is configured to provide uniform distribution of gases passing through the gas distribution assembly 118 into the process region 112.

The gas distribution plate 158 is typically fabricated from stainless steel, aluminum (Al), anodized aluminum, nickel (Ni) or another RF conductive material. The gas distribution plate 158 is configured with a thickness that maintains sufficient flatness and uniformity so as to not adversely affect substrate processing. In one embodiment the gas distribution plate 158 has a thickness between about 1.0 inch and about 2.0 inches.

In addition to inlet 180, the chamber body 102 may optionally include a second inlet 182 that provides reactive species from a remote plasma source. The remote plasma source may be the same remote plasma source 166 that provides reactive species to the processing region through the inlet 180 via the gas distribution assembly 118. The second inlet 182 is configured to provide reactive species from the remote plasma source into the processing region 112 of the chamber 103 while bypassing the gas distribution assembly 118. In other words, the reactive species provided by the second inlet 182 do not pass through the perforated gas distribution plate 158 of the gas distribution assembly 118. The second inlet 182 may be located in a sidewall 106 of the chamber body 102 below the gas distribution assembly 118, such as between the gas distribution plate 158 and the substrate support 124. A gas line 184 from the remote plasma source to the second inlet 182 delivers reactive species from the remote plasma source to the processing region 112 of the chamber 103 through the second inlet 182. In such an embodiment, a diverter 119 is provided in the conduit 177 from the remote plasma source. The diverter 119 allows a first portion of the reactive species from the remote plasma source 166 to be directed to the first inlet 180 of the chamber 103 via pipe 142 between the diverter 119 and the chamber 103 and a second portion of the reactive species from the remote plasma source to be directed to the second inlet 182 of the chamber via line 184 between the diverter 119 and the chamber 103.

A temperature controlled substrate support assembly 138 is centrally disposed within the chamber 103. The support assembly 138 supports a substrate 140 during processing. In one embodiment, the substrate support assembly 138 comprises a substrate support 124 having an aluminum or aluminum nitride body that encapsulates at least one embedded heater 132. The heater 132, such as a resistive element, disposed in the support assembly 138, is coupled to an optional power source 174 and controllably heats the support assembly 138 and the substrate 140 positioned thereon to a predetermined temperature.

Generally, the support assembly 138 has a substrate support 124 comprising a lower side 126 and an upper side 134. The upper side 134 supports the substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the chemical vapor deposition chamber 103. The stem 142 additionally provides a conduit for electrical and thermocouple leads between the support assembly 138 and other components of the system 100.

A bellows 146 is coupled between support assembly 138 (or the stem 142) and the bottom 108 of the chemical vapor deposition chamber 103. The bellows 146 provides a vacuum seal between the processing region 112 and the atmosphere outside the chemical vapor deposition chamber 103 while facilitating vertical movement of the support assembly 138.

The support assembly 138 generally is grounded such that RF power supplied by a power source 122 to the gas distribution assembly 118 positioned between the lid assembly 110 and substrate support assembly 138 (or other electrode positioned within or near the lid assembly of the chamber) may excite gases present in the processing region 112 between the support assembly 138 and the gas distribution assembly 118. The support assembly 138 additionally supports a circumscribing shadow frame 148. Generally, the shadow frame 148 prevents deposition at the edge of the substrate 140 and support assembly 138 so that the substrate does not adhere to the support assembly 138. The support assembly 138 has a plurality of holes 128 disposed therethrough that accept a plurality of lift pins 150.

Figure 2A:
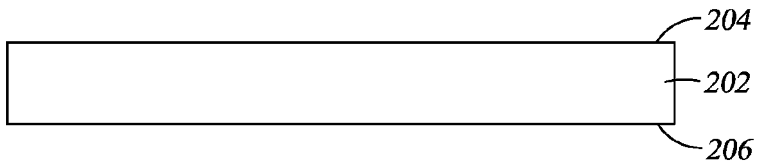
FIGS. 2A-2D illustrate a method for forming a protective coating on a heater plate according to an embodiment.
Figure 2B:
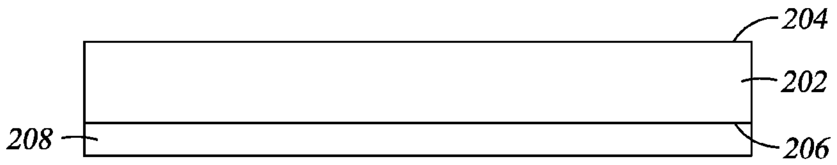
Figure 2C:
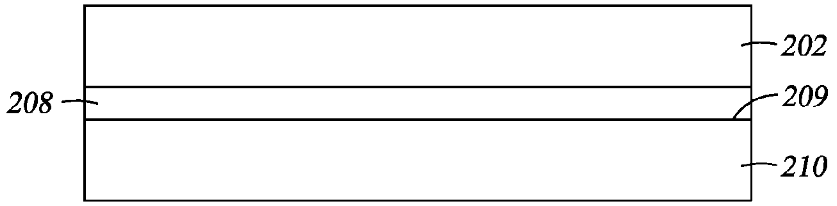
Figure 2D:
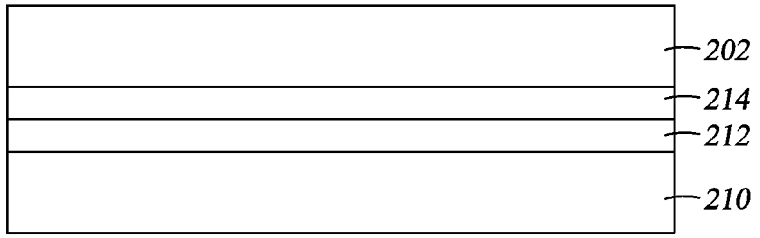

FIGS. 2A and 2D illustrate a method for forming a protective coating 202 over a substrate support 210 according to one embodiment. The substrate support 210 may be a heater plate comprising aluminum nitride. The protective coating 202 may be a premade plate prepared using ceramic sintering technique, as shown in FIG. 2A. The plate 206 may comprise pure yttria or predominantly yttria based materials, such as $Y_2O_3$—$ZrO_2$—$Al_2O_3$. The reason pure yttria and yttria based material are selected is that these materials show much better plasma erosion resistance than aluminum nitride. Having a protective coating 202 comprising yttria or yttria based material will significantly reduce or eliminate aluminum fluorides formation, and also will largely increase heater lifetime. However, adhesion of yttria based material to aluminum nitride heater plate has proven to be problematic, and, after sufficient thermal cycling of the heater, the yttria may flake off introducing new contamination into the process chamber and exposing the aluminum nitride heater plate to cleaning agents. It has been discovered that diffusion bonding the yttria based material to the aluminum nitride heater plate will create a stronger bond between the yttria based material and the aluminum nitride heater plate.

When forming the yttria based plate 202, for $Y_2O_3$—$ZrO_2$—$Al_2O_3$ material, the starting raw powder is predominantly $Y_2O_3$ with $ZrO_2$ and $Al_2O_3$, and the final sintered phase is $Y_4Al_2O_9$ (YAM) and $Y_{2-x}Zr_xO_3$ ($Y_2O_3$—$ZrO_2$ solid solution). The starting powder composition may be 76.9 wt % $Y_2O_3$, 15.4 wt % $ZrO_2$ and 7.7 wt % $Al_2O_3$. The plate 202 may have the same diameter as the aluminum nitride heater plate 210. The yttria based plate 202 may have a thickness from about 2 mm to about 5 mm, and has a first surface 204 and a second surface 206. The second surface 206 may be polished with a surface roughness of less than 10 microinches. The first surface 204 may be kept under the sintered condition. Next, as shown in FIG. 2B, a silicon containing layer 208 is coated on the second surface 206 of the plate 202. The silicon containing layer 208 may comprise silicon dioxide and have a thickness from about 1 micron to about 20 microns. The silicon containing layer 208 may be formed on the second surface 206 using any suitable method, such as chemical vapor deposition (CVD), physical vapor deposition (PVD), screen printing, etc.

Next, as shown in FIG. 2C, an upper surface 209 of the heater plate 210 is polished with a surface roughness of less than 10 microinches and the silicon containing layer 208 and the plate 202 are placed on the polished surface 209. The heater plate 210 may already have lift pin holes, dots and/or seal bands formed therein. The silicon containing layer 208 is contacting the polished surface 209. The heater plate 210, the silicon containing layer 208 and the plate 202 are then heated to a temperature ranging from 1000 degrees Celsius to 1600 degrees Celsius, such as about 1400 degrees Celsius, for about three hours in nitrogen protected atmosphere. The reason silicon containing layer 208, such as silicon dioxide, is selected for diffusion bonding of the yttria based plate 202 to the aluminum nitride heater plate 210 is that silicon dioxide reacts with yttrium oxide and aluminum oxide to form liquid phase at a temperature of about 1400 degrees Celsius. The liquid phase will diffuse into yttria based plate 202 and aluminum nitride heater plate 210 and interface layers 212, 214 may be formed after cooling, as shown in FIG. 2D. The heating/cooling rate ranges from about 0.1 degrees Celsius per minute to about 20 degrees Celsius per minute. The interface layers 212, 214 will tightly bond the yttria based plate 202 to the aluminum nitride heater plate 210. Both interface layers 212, 214 may contain silicon. In one embodiment, the interface layer 212 is $Al_6Si_2O_{13}$ and the interface layer 214 is $Y_2Si_2O_7$.

The yttria based plate 202 after diffusion bonded to the aluminum nitride heater plate 210 is then machined and/or polished to form required surface features such as dots, seal bands, lift pin holes, etc. The thickness of the diffusion bonded yttria based plate 202 may be from about 100 microns to about 2 mm, depending on the heater performance requirement.

In summary, diffusion bonded pure yttria or predominantly yttria based plate over aluminum nitride heater plate significantly improves plasma resistance performance, increases heater lifetime and improves chamber performance.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:

a stem;

a heater plate coupled to the stem, wherein the heater plate encapsulates at least one embedded heater;

a bonding layer disposed on the heater plate, wherein the bonding layer comprises a first layer comprising silicon and aluminum and a second layer consisting of $Y_2Si_2O_7$; and a third layer bonded to and in direct contact with the second layer, wherein the second layer is between the first layer and the third layer, and the third layer comprises yttria and is distinct from the second layer and the first layer.

2. The substrate support of claim 1, wherein the heater plate comprises aluminum nitride.

3. The substrate support of claim 2, wherein the first layer is $Al_6Si_2O_{13}$.

4. The substrate support of claim 1, wherein the third layer has a thickness of about 100 microns to about 2 mm.

5. The substrate support of claim 1, wherein the third layer consists of $Y_2O_3$—$ZrO_2$—$Al_2O_3$.

6. A substrate support, comprising:

a stem;

a heater plate coupled to the stem, wherein the heater plate comprises aluminum nitride and encapsulates at least one embedded heater;

a first layer disposed on the heater plate, wherein the first layer comprises silicon;

a second layer disposed on the first layer, wherein the second layer consists of $Y_2Si_2O_7$ and is distinct from the first layer; and a third layer disposed on and in direct contact with the second layer, wherein the second layer is between the first layer and the third layer, and the third layer consists of $Y_2O_3$—$ZrO_2$—$Al_2O_3$ and is distinct from the first layer and the second layer.

7. The substrate support of claim 6, wherein the first layer is $Al_6Si_2O_{13}$.

8. The substrate support of claim 6, wherein the third layer has a thickness of about 100 microns to about 2 mm.

9. A substrate support, comprising:

a stem;

a heater plate coupled to the stem, wherein the heater plate encapsulates at least one embedded heater;

a bonding layer disposed on the heater plate, wherein the bonding layer comprises a first layer consisting of $Al_6Si_2O_{13}$ and a second layer consisting of $Y_2Si_2O_7$; and a third layer disposed on and in direct contact with the second layer, wherein the second layer is between the first layer and the third layer, and the third layer comprises yttria and is distinct from the first layer and the second layer.

10. The substrate support of claim 9, wherein the heater plate comprises aluminum nitride.

11. The substrate support of claim 10, wherein the third layer consists of $Y_2O_3$—$ZrO_2$—$Al_2O_3$.

12. The substrate support of claim 11, wherein the third layer has a thickness of about 100 microns to about 2 mm.

* * * * *